(12) United States Patent
Shen et al.

(10) Patent No.: US 7,532,079 B2
(45) Date of Patent: May 12, 2009

(54) DIGITAL TUNING OF CRYSTAL OSCILLATORS

(75) Inventors: David H. Shen, Saratoga, CA (US); Ann P. Shen, Saratoga, CA (US)

(73) Assignee: NanoAmp Solutions, Inc. (Cayman), Santa Clara, CA (US)

( * ) Notice: Subject to any disclaimer, the term of this patent is extended or adjusted under 35 U.S.C. 154(b) by 44 days.

(21) Appl. No.: 11/764,701

(22) Filed: Jun. 18, 2007

(65) Prior Publication Data

US 2008/0309424 A1 Dec. 18, 2008

(51) Int. Cl.
*H03B 5/00* (2006.01)

(52) U.S. Cl. ............. 331/116 FE; 331/175; 331/179; 331/116 R; 331/177 V (58) Field of Classification Search ............. 331/116 R, 331/116 FE, 158–159, 175, 179, 177 V
See application file for complete search history.

(56) References Cited

U.S. PATENT DOCUMENTS

| | | | |
|---|---|---|---|
| 5,084,685 A | 1/1992 | Möller et al. | |
| 5,117,206 A | 5/1992 | Imamura | |
| 5,117,234 A | 5/1992 | Shizawa | |
| 6,181,218 B1 | 1/2001 | Clark et al. | |
| 6,304,152 B1 | 10/2001 | Takahashi et al. | |
| 6,400,231 B1 * | 6/2002 | Leduc et al. | ........... 331/116 FE |
| 6,658,748 B1 * | 12/2003 | Leipold et al. | .............. 331/179 |
| 6,747,522 B2 | 6/2004 | Pietruszynski et al. | |
| 6,980,139 B2 | 12/2005 | Doerrer et al. | |
| 7,046,098 B2 * | 5/2006 | Staszewski | .................. 331/158 |

OTHER PUBLICATIONS

"Transceiver Architecture Selection: Review, State-of the-Art Survey and Case Study", IEEE Circuits and Systems Magazine, vol. 7, No. 2, Second Quarter 2007, ISSN 1531-636X, pp. 6-26.
International Search Report, International Application No. PCT/US2007/071493, dated Mar. 25, 2008, 69 pages.

* cited by examiner

*Primary Examiner*—James H. Cho
*Assistant Examiner*—Christopher Lo
(74) *Attorney, Agent, or Firm*—Fish & Richardson P.C.

(57) ABSTRACT

Embodiments feature techniques and systems for digitally tuning a crystal oscillator circuit. In one aspect, embodiments feature a method for making a digitally tuned crystal oscillator circuit. The method involves receiving a multi-bit input signal into a digital modulator, modulating the multi-bit input signal with the digital modulator by oversampling or by noiseshaping and oversampling to produce a digitally-modulated output signal having a lower number of bits than the multi-bit input signal. The method also involves coupling a tuning capacitor with the crystal oscillator circuit, and coupling the digitally-modulated output signal from the digital modulator to the crystal oscillator circuit and the tuning capacitor. In some embodiments, the digital modulator can a delta-sigma modulator, a noiseshaping modulator, a delta modulator, a pulse width modulator, a differential modulator, or a continuous-slope delta modulator.

25 Claims, 8 Drawing Sheets

DIGITAL TUNING OF CRYSTAL OSCILLATORS

TECHNICAL FIELD

The present disclosure relates to circuitry, such as oscillators, for wireline and wireless communications.

BACKGROUND

The crystal oscillator is typically the source of frequency stability for various communications systems. The crystal is typically made of quartz and has resonating capabilities. Quartz is a material with piezoelectric properties that can be cut at certain angles and thicknesses to provide electrical and mechanical stability in radio frequency (RF) circuit designs. A typical crystal oscillator can be manufactured to achieve tolerances of less than 10 ppm (parts per million), but larger tolerances tend to be less expensive to manufacture. The crystal can be "tuned," that is, adjusting the resonant frequency to a desired frequency through open-loop or closed-loop control in order to achieve tighter tolerances or to ease manufacturing requirements.

Because the crystal oscillator is an inherently stable resonator, this oscillator can be used in many types of electronic oscillator circuit topologies. For example, these oscillator circuit topologies can include the Colpitts, Hartley, and Pierce oscillator circuit topologies.

SUMMARY

The present disclosure describes techniques and systems for digitally tuning a crystal oscillator circuit. In general, in one aspect, embodiments of the invention feature a method for making a digitally tuned crystal oscillator circuit. The method involves receiving a multi-bit input signal into a digital modulator, modulating the multi-bit input signal with the digital modulator by oversampling or by noiseshaping and oversampling to produce a digitally-modulated output signal having a lower number of bits than the multi-bit input signal. The method also involves coupling a tuning capacitor with the crystal oscillator circuit, and coupling the digitally-modulated output signal from the digital modulator to the crystal oscillator circuit and the tuning capacitor.

These and other embodiments can optionally include one or more of the following features. The method can involve adjusting a capacitance of the tuning capacitor with the digitally-modulated output signal to tune the frequency of the crystal oscillator. The adjustment of the capacitor can involve modulating a switch for the tuning capacitor, and the tuning capacitor can include an array of switched capacitors. The method can include any combination of oversampling, noiseshaping, or oversampling and noiseshaping.

In some embodiments, the method can involve adjusting a capacitance of the switched capacitor array with the digitally-modulated output signal to tune the frequency of the crystal oscillator circuit. The tuning capacitor can include adjusting a capacitance of a varactor. The adjustment can include producing an equivalent control voltage for generating an average capacitance of the varactor. The average capacitance of the varactor can be a function of an average of reference voltages that are switched by the digitally-modulated output signal. The digital modulator can be a delta-sigma modulator, a delta modulator, a pulse-width modulator, a differential modulator, or a continuous-slope delta modulator. The method may also include adding a dithering signal to the digitally-modulated output signal to minimize error in the digitally-modulated output signal by reducing fixed pattern noise in the digitally-modulated output signal.

In general, in another aspect, embodiments of the invention feature a tuning circuit for digitally tuning a frequency of a crystal oscillator circuit having a quartz crystal. The tuning circuit includes a modulator circuit to produce a digitally-modulated output signal by noiseshaping or oversampling a multi-bit input signal. The modulator includes an input for the multi-bit input signal and an output that has a lower number of bits than the input. The circuit also includes a tuning capacitor coupled with the crystal oscillator circuit, in which the output of the modulator circuit is coupled to the tuning capacitor for the digitally-modulated signal to adjust a capacitance of the tuning capacitor to tune the frequency of the crystal oscillator circuit.

Particular embodiments of the invention can be implemented to realize one or more of the following advantages. The tuning capacitor can be a switched capacitor, where the switched capacitor can include a capacitor coupled with a switch that is configured to be switched with the digitally-modulated output signal. In some embodiments, the tuning capacitor can include a first tuning capacitor that has a capacitance that is configured to be adjusted by circuitry to generate an average of switched-reference voltages, where the reference voltages can be switched by the digitally-modulated output signal. The tuning capacitor can have an array of switched capacitors, in which the switched capacitors can be configured to be modulated with the output of the modulator circuit.

In some embodiments, the digital modulator can be any of a delta-sigma modulator, a noiseshaping modulator, a delta modulator, a pulse width modulator, a differential modulator, or a continuous slope delta modulator. The tuning capacitor may include a varactor. The tuning circuit can include circuitry to produce an equivalent control voltage for an average capacitance of the varactor. The circuit may also include a dithering circuit with a dithering output coupled to the output of the modulator circuit to add a dithering signal to the digitally-modulated output signal to minimize error in the digitally-modulated output signal.

In general, in another aspect, embodiments of the invention feature a system that includes a crystal oscillator circuit comprising a quartz crystal, and a modulator circuit to produce a digitally-modulated output signal. The modulator includes an input for the multi-bit input signal and an output having a lower number of bits than the input. The modulator includes a delta-sigma or oversampling modulator to noiseshape or oversample the digitally-modulated output signal. The system includes a tuning capacitor coupled with the crystal oscillator circuit, in which the output of the modulator circuit is coupled to the tuning capacitor for the digitally-modulated signal to adjust a capacitance of the tuning capacitor to tune the frequency of the crystal oscillator circuit. The system includes a dithering circuit with a dithering output, and a summing circuit to couple the dithering output with the output of the modulator circuit to add the dithering signal to the digitally-modulated output signal for error reduction in the digitally-modulated signal.

Particular embodiments of the invention can be implemented to realize one or more of the following advantages. The dithering output can have a lower number of bits than the digitally-modulated output signal, and the summing circuit can be configured to add the dithering signal to a number of least significant bits (LSBs) in the digitally-modulated output signal. The summing circuit can be configured to reduce an energy of fixed pattern noise and/or spurious responses in the digitally-modulated output signal. The crystal oscillator circuit can be coupled in a receiver or transceiver architecture, in which the receiver or transceiver can have an architecture that includes a superheterodyne receiver, an image-rejection receiver, a zero-intermediate frequency (IF) receiver, a low-IF receiver, a direct-up transceiver, or a two-step up transceiver.

Particular implementations may provide one or more following advantages for implementing digital frequency control of crystal oscillators. In some implementations, for example, the disclosed tuning technique can use digital modulation to tune the frequency of crystal oscillators to achieve fine frequency resolution in excess of ten bits while keeping manufacturing costs and circuitry area low. The digital modulation can include various forms of oversampling modulators, such as delta sigma modulators. By employing single-bit control or control with a low number of bits, the frequency of the crystal oscillator can be controlled to a much higher equivalent number of bits.

Also disclosed is a method to integrate the digital frequency control for the crystal oscillator in a lower-cost and higher-accuracy design with low process variation and sensitivity than is achievable in conventional circuit designs. Another potential advantage is that the techniques disclosed can require a lower amount of die area than designs for conventional oscillator tuning techniques. For example, when compared to conventional techniques, the disclosed techniques and systems can result in a lower number of capacitors that are used for tuning the crystal oscillator. As a result, the amount of die area required for tuning capacitor designs and layouts can be reduced.

Details of one or more implementations are set forth in the accompanying drawings and the description herein. Other features, aspects, and advantages will be apparent from the description, the drawings, and the claims.

DESCRIPTION OF THE DRAWINGS

Like reference numbers and designations in the various drawings indicate like elements.

DETAILED DESCRIPTION

Figure 1:
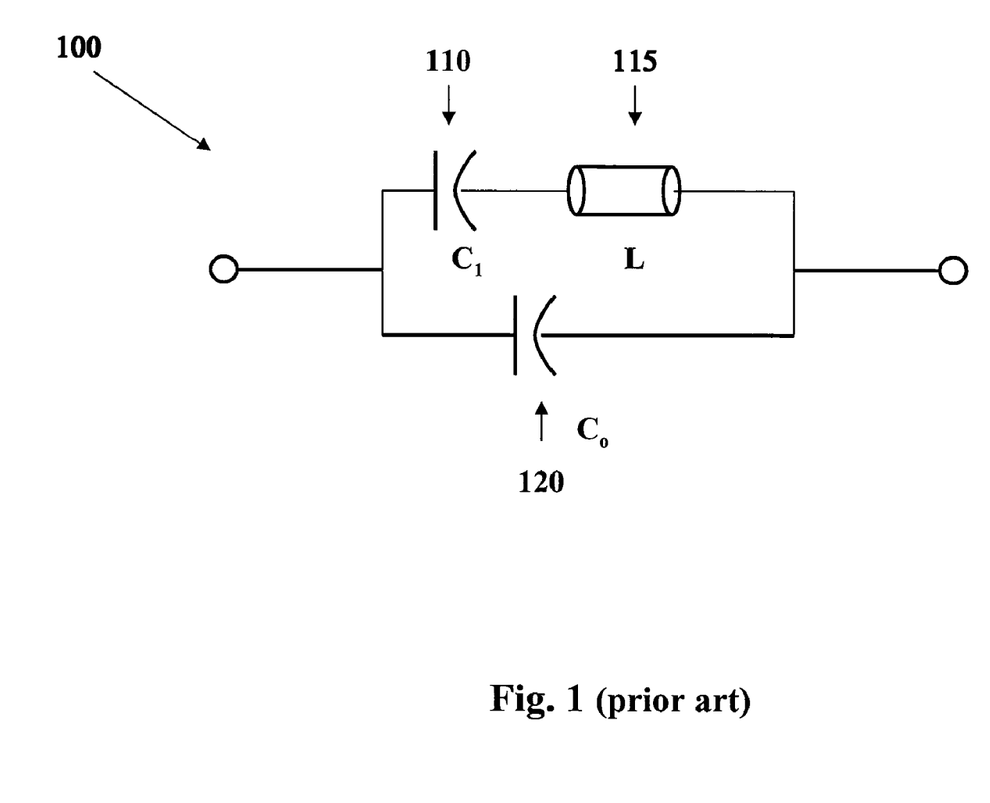
FIG. 1 is a model of a crystal device as a passive L and C network.

FIG. 1 shows a simplified model 100 of the crystal device as a passive L and C network, with capacitor elements C1 110, Co 120, and inductor element L 115. Capacitor Co 120 represents the parallel plate capacitance, such as the capacitance from wires and contacts. Capacitor C1 110 and inductor L 115 represent the energy storage in the model. Since the quartz crystal has a high Q value, the series capacitance C1 110 is very low and the series inductance L 115 is very high.

There are a few conventional methods of controlling the crystal oscillator frequency. By modeling the crystal as a high quality L-C resonator as in FIG. 1, the resonant frequency of the crystal can be "pulled" by adding parallel and/or series resonant components, such as capacitors as loads to the resonant circuit. The pulling can be done, for example, through analog controlling a variable capacitor device (varactor) or through digital means via tuning a weighted array of capacitor.

Figure 2:
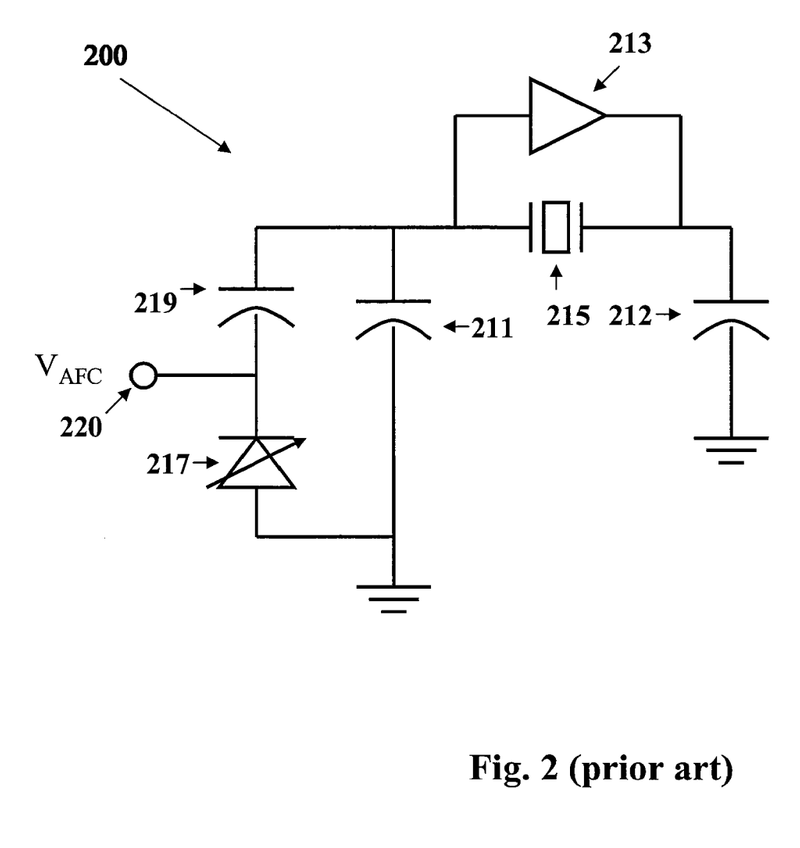
FIG. 2 shows a model of a conventional crystal oscillator circuit.

FIG. 2 shows a model 200 of a conventional crystal oscillator circuit. FIG. 2 shows an example where the resonant frequency of the crystal can be "pulled" through analog control of a variable capacitor device, varactor 217. In FIG. 2, an inverting amplifier 213 is put in parallel with a crystal 215 to form a crystal oscillator circuit. The parallel load capacitors 211 and 212 are used to set a nominal fixed frequency of the resonant circuit. The varactor 217 is tuned by an analog control voltage 220, $V_{AFC}$, which is used to tune the frequency of the crystal oscillator. The varactor 217 is coupled to the crystal 215 through a capacitor 219. Analog control circuit topologies other than the model 200 shown in FIG. 2 may be designed, such as topologies using dual varactors or topologies that couple the varactor to the crystal 215 with resistors instead of capacitors.

Figure 3:
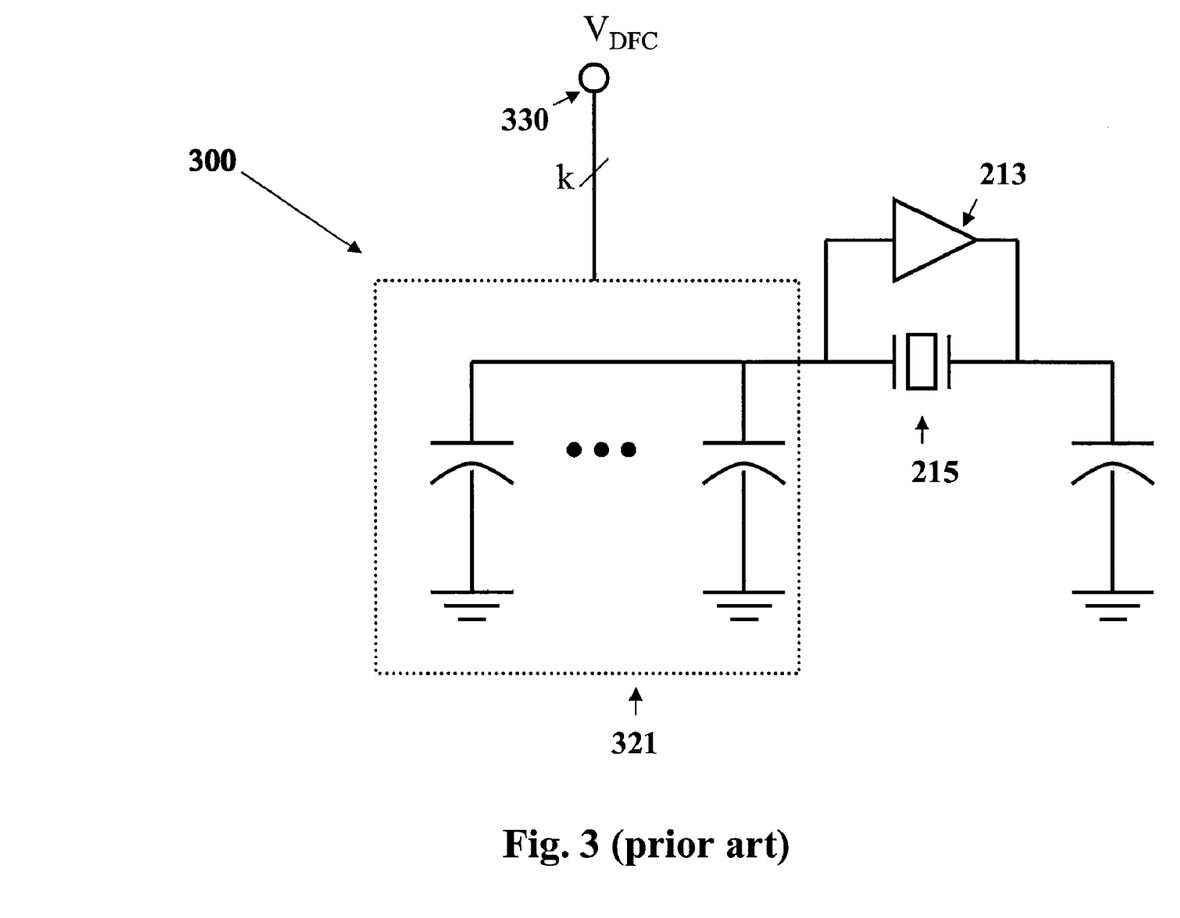
FIG. 3 is a model of a conventional digitally-controlled crystal oscillator.

FIG. 3 shows a model 300 of a conventional crystal oscillator circuit. FIG. 3 shows an example where the resonant frequency of the crystal can be "pulled" through digital means by tuning a weighted array of capacitors. An advantage of using digital control (e.g., FIG. 3) in contrast with analog control (e.g., FIG. 2) is that the digital control circuits can be more easily implemented and integrated into an overall integrated circuit system, especially for circuit implementations using digital process technologies. Another advantage that digital control has over analog control is that the digital control can be more easily controlled since the digital control is performed through digital processor circuitry rather than analog techniques. The digitally-controlled frequency tuning design may be referred to as a digitally-compensated crystal oscillator (DCXO). In some implementations, by using a switched capacitor array for load capacitance, the range of tuning can be improved over what is achievable with an analog varactor.

The model 300 of FIG. 3 shows the amplifier 213 in parallel with the crystal 215. FIG. 3 also has a digitally programmable parallel capacitor array 321 that can be used as a tunable load with $2^k$ possible values. The array 321 has a k-bit control word from the digital frequency control input 330, $V_{DFC}$. Even though a single-ended load is shown in the embodiment of the model 300, a single-ended or differential load can be implemented.

In order for the conventional design to achieve a large number of bits of digital control and to achieve monotonic accuracy, the conventional design will use a substantial amount of die area in the implementation. Due to sensitivity in process variations, monotonic operation cannot be achieved using a design that only has a binary-weighted capacitor array to enhance precision when the number of bits of accuracy desired is greater than eight bits. As a result, techniques such as mixed binary and linear weighting for capacitors have been implemented. However, these conventional capacitor matching techniques also result in large die area penalties for the capacitor layout. Since the amount of capacitor mismatch from manufacturing variations is inversely proportional to device area, a large die area is required for the capacitors to have good matching characteristics. In conventional designs, good matching characteristics of the capacitors are required to achieve good monotonic accuracy, precision, and control.

Figure 4:
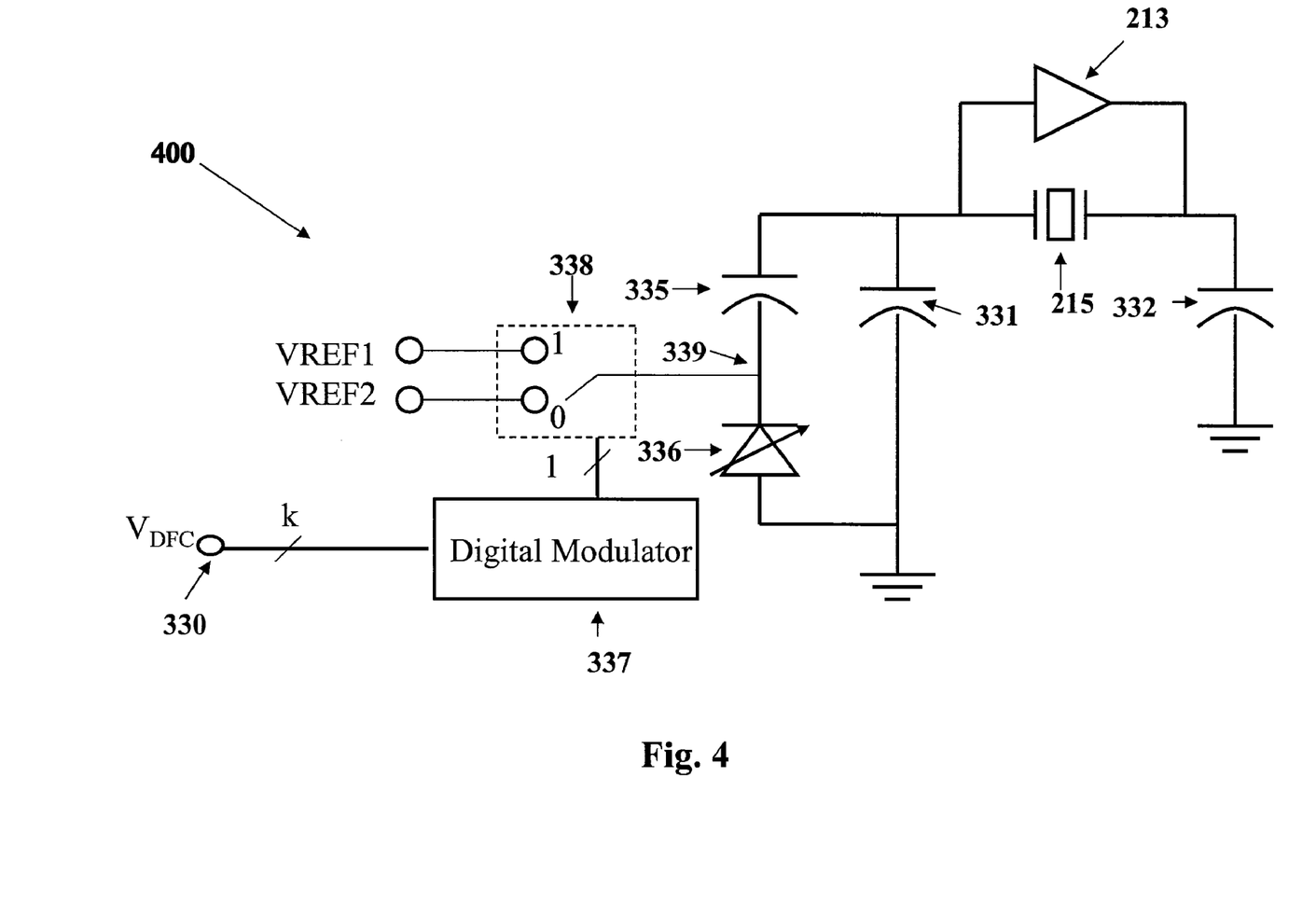
FIG. 4 is an example embodiment of the disclosed technique for the crystal oscillator.

FIG. 4 is an example embodiment of a model 400 for the disclosed technique for a crystal oscillator. In FIG. 4, the inverting amplifier 213 is in parallel with the crystal 215, and the capacitor loads 331 and 332 are fixed tuning capacitors loads. A digital modulator 337 converts a k-bit digital control word 330 at the digital frequency control input, $V_{DFC}$, to a one-bit switched control signal that is of a modulated frequency. The modulator 337 can be a conventional delta-sigma modulator or some other conventional oversampling or noise-shaping modulator. Sigma-delta modulators can also refer to delta-sigma modulators. Switch 338 is used to switch node 339 between reference voltages VREF1 and VREF2 based on a value of the one bit digital modulator output. Node 339 is the node that couples a first tuning capacitor 335 with the varactor 336, and is used as a control node for setting the varactor capacitance. If VREF1 is switched to couple to node 339 when the output of the digital modulator is 1 and VREF2 is switched to couple to node 339 when the output of the digital modulator is 0, an average value of the digitally modulated signal, $K_{av}$, is impressed upon the control node 339 to provide an equivalent voltage control value of ($K_{av}$*VREF1+(1-$K_{av}$)*VREF2) at which the average capacitance of the varactor 336 can be determined.

The bit resolution of the capacitance tuning can be increased by using oversampling or noise-shaping techniques, which trade-off bit resolution with sampling frequency, well known in the art for data conversion. An advantage of using oversampling or noise-shaping techniques is that the digital bit resolution is relatively insensitive to device matching characteristics. Another advantage of implementing oversampling or noise-shaping techniques is that the amount of die area required to implement the oversampling or noise-shaping controller and digital circuitry is much lower when compared to conventional designs for achieving high levels of resolution.

Figure 5:
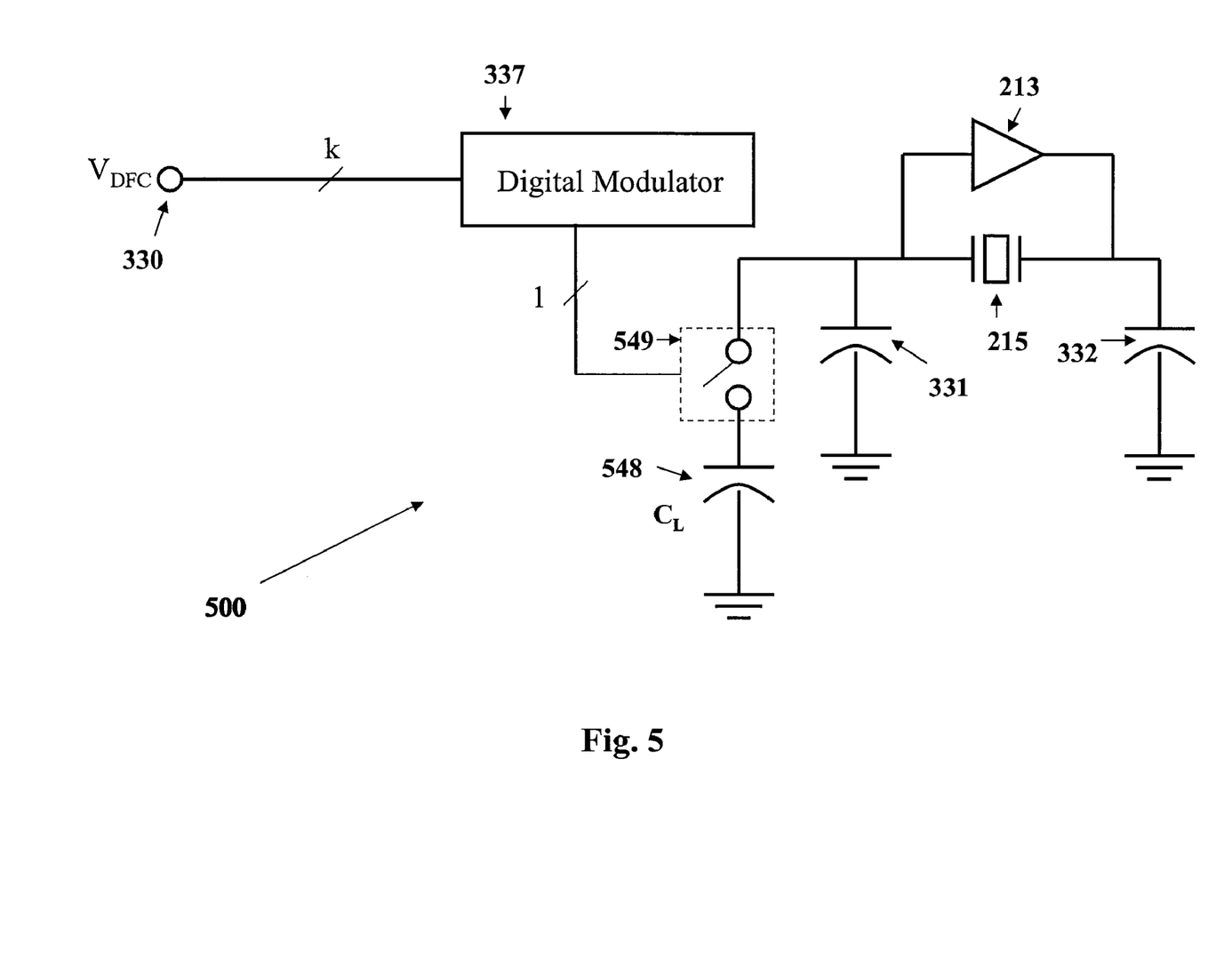
FIG. 5 is an example embodiment of the disclosed technique for the crystal oscillator.

FIG. 5 is another example embodiment of the disclosed technique for tuning the frequency of the crystal oscillator. In this embodiment, the inverting amplifier 213 is placed in parallel with crystal 215, and fixed capacitors 331 and 332 provide a nominal tuning of the oscillator frequency. The resonant circuit within this example embodiment includes components 213, 215, 331, and 332.

A digital modulator 337 converts a k-bit digital control word 330 at the digital frequency control input, $V_{DFC}$ to a one-bit switched control signal that has a modulated frequency. The digital modulator 337 can be a delta-sigma modulator or some other type of oversampling or noise-shaping modulators. The one-bit modulator output is used to control switch 549 to switch a load capacitor $C_L$ 548 in parallel with the resonant circuit. The average value of the digitally modulated signal, $K_{av}$, from the modulator 337 modulates the parallel capacitance load of capacitors 331 and 332 by $K_{av}$*$C_L$. The combination of the switch 549 in series with the load capacitor $C_L$ 548 can be referred to as a switched capacitor.

Figure 6:
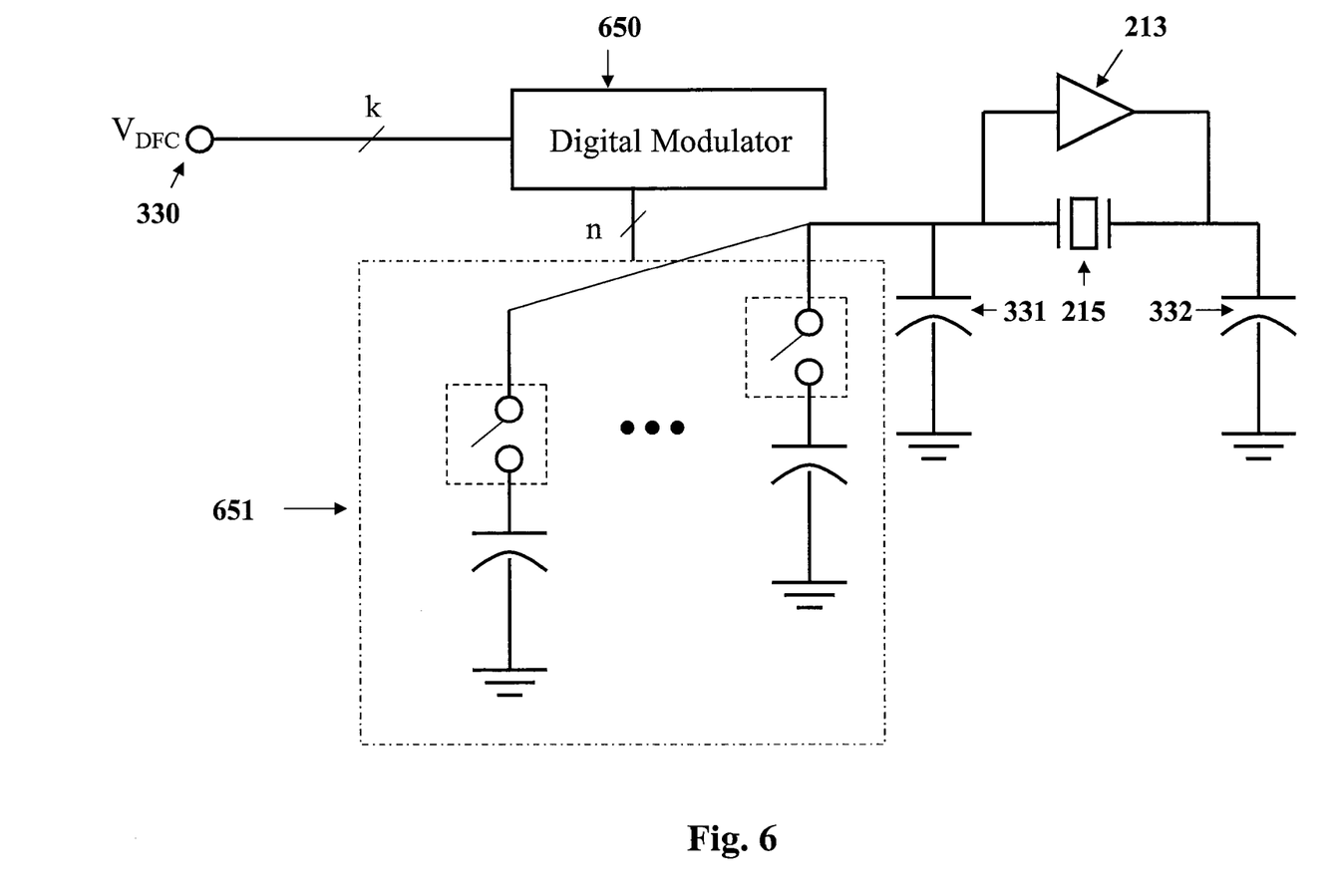
FIG. 6 is an example embodiment of the disclosed technique for the crystal oscillator.

FIG. 6 shows a different example embodiment of the disclosed technique for tuning the frequency of the crystal oscillator. In this embodiment, the inverting amplifier 213 is placed in parallel with crystal 215, and fixed capacitors 331 and 332 provide a nominal tuning of the oscillator frequency. The resonant load within this example embodiment includes components 213, 215, 331, and 332. In particular, FIG. 6 shows an example block diagram of an oversampling or a noise-shaping digital modulator 650 that has a k-bit input control word 330 at the digital frequency control input, $V_{DFC}$ and an n-bit output, where n<k. Such an oversampling or a noise-shaping modulator can be used to control an array 651 of n switches to modulate the resonant load of the circuit. The array 651 may also be referred to as an array of switched capacitors.

Figure 7:
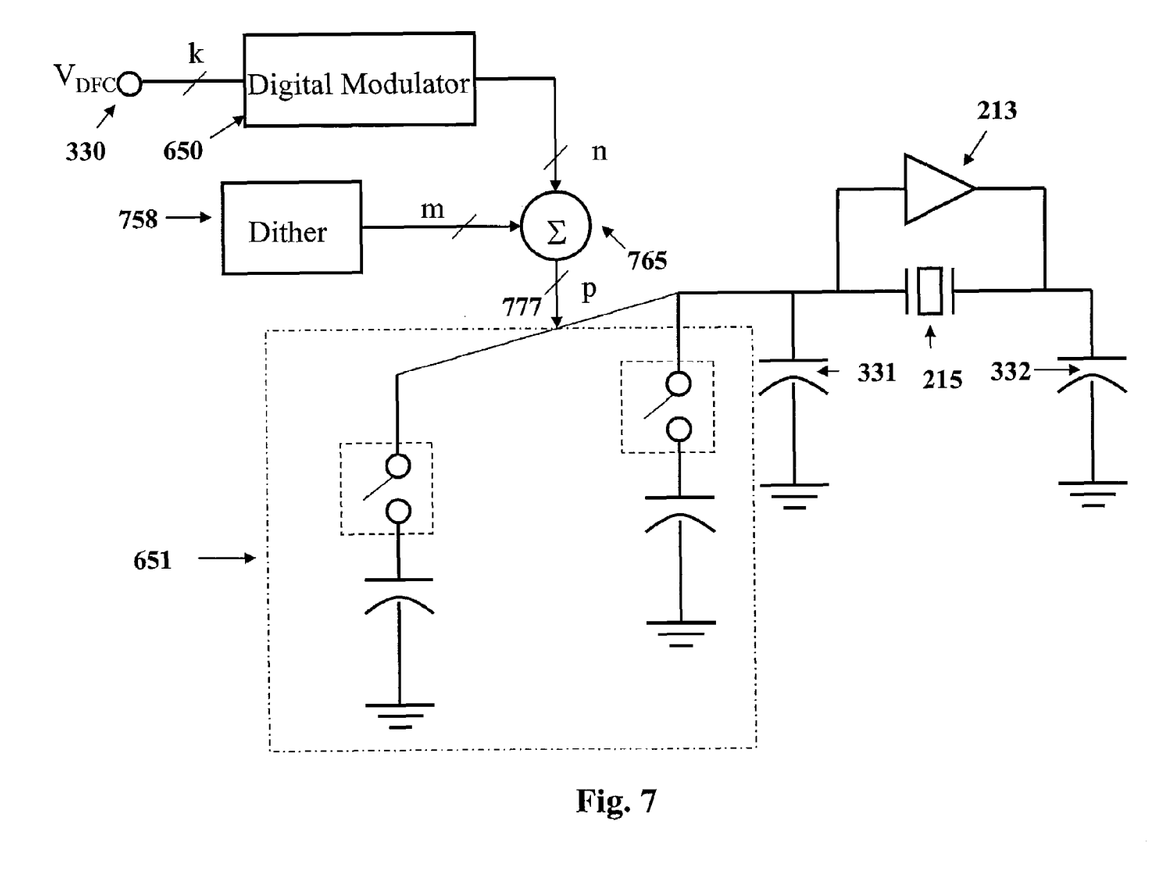
FIG. 7 is an example embodiment of the disclosed technique for the crystal oscillator.

FIG. 7 shows an example of a block diagram where a dithering signal is added to the output of the digital modulator to improve modulation performance of the digital tuning technique. Typical digital modulators can produce fixed pattern noise in the n-bit output signal as a result of limit cycles or other repetitive digital patterns that may derive from imperfections in the digital modulator implementation. In particular, FIG. 7 shows an embodiment of the disclosed technique that includes a digital modulator 650, a dithering circuit 758, and a summing circuit 765. A dither signal can be referred to as a form of noise or data which is added to digitally modulated data for the purpose of minimizing error in the output signal of the digital modulator 650. The dither signal may be a pseudo-random generated sequence with white noise characteristics. The digital modulator 650 has a k-bit input control word 330 at the digital frequency control input, $V_{DFC}$, and an n-bit output. The dithering circuit 758 has an m-bit noise code output. In some implementations, the m bits may only be a few bits and may be added to a few least significant bits (LSBs) of the n-bit output of the digital modulator 650. The addition of the dither signal to the output signal of the digital modulator can randomize low spur levels and reduce error in the output signal of the digital modulator 650.

In FIG. 7, the n-bit output of the digital modulator 650 can be modified by adding a dithering signal of m bits at the summing circuit 765 to produce a p-bit output signal 777 to reduce the energy of fixed pattern noise that would ordinarily result in spurious responses and lower resolution. In some implementations, the m-bit-signal does not substantially alter the nature of the n-bit signal from the digital modulator 650. In these implementations, when the m-bit signal is summed with the n-bit signal, the nature of the p-bit signal does not substantially differ from the n-bit signal. As a result, the number of bits for the p-bit signal can be equal to the number of bits in the n-bit signal, and in some implementations, can be somewhat greater than n, or even somewhat less than n if truncation of the LSB is desired. In some implementations, the p-bit signal 777 can be substituted for the signal at the output of the digital modulator 650 for FIG. 6 and the digital modulator 337 for FIGS. 4-5. In general, p should be less than k to have a useful tradeoff between increasing oversampling frequency and reducing the number of output bits.

Figure 8:
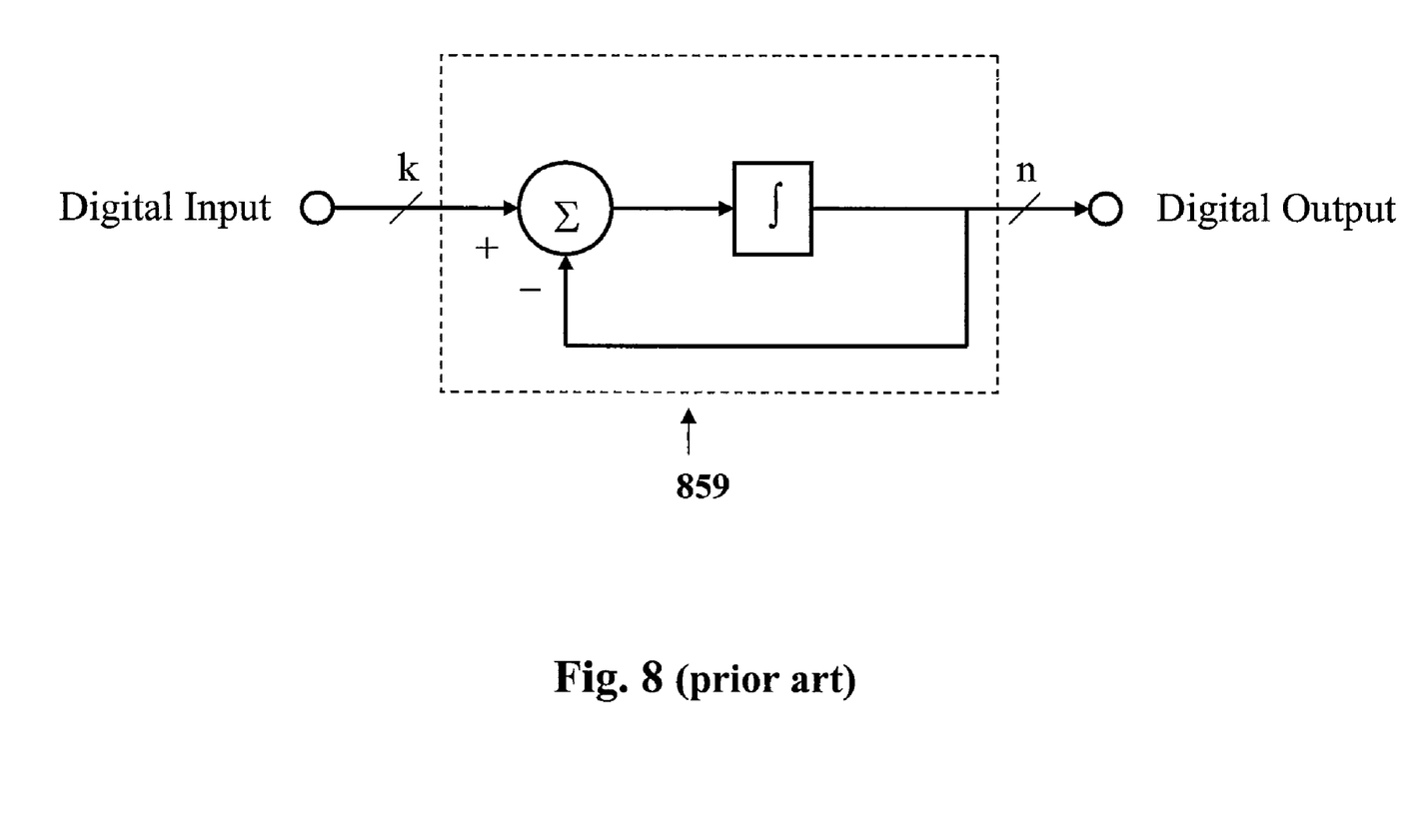
FIG. 8 is an example block diagram of a delta-sigma modulator.

FIG. 8 shows an example of a first-order delta-sigma modulator implementation that shapes the noise of the digital modulator 859. Noise-shaping digital modulators can improve the in-phase noise performance, however, at the cost of higher out-of-band noise. An oversampling or a noise-shaping digital modulator can be relatively insensitive to device tolerances and matching. Higher oversampling ratios for digital modulators can give higher equivalent bit resolution. This disclosure provides an advantage in that the high quality factor of the resonant crystal circuit has a natural filtering capability of out-of-band noise so that the noise-shaping modulator can be used without any additional filters. In an another benefit, higher order delta-sigma modulators can be used to reduce the impact of spurious responses due to limit cycles. Some higher order delta-sigma modulators can include MASH and cascade modulators. In some embodiments, other types of modulators that can be used include delta modulators, pulse-width modulators, differential modulators, and continuous-slope delta modulators.

While all of the implementations presented herein use single-ended structures, differential structures can be used in their place with the added advantages of improved symmetry and increased robustness to noise. In addition, various types of oversampling or noise-shaping modulators, including delta-sigma modulators of various orders, numbers of output bits, structures, and implementations can be used. Fractional accumulators and other digital modulators could be used as well. Various topologies for oscillators and parallel or series resonant loads for tuning the oscillator can also be used. The exemplary designs shown are not limited to CMOS process technology, but may also use other process technologies, such as BiCMOS (Bipolar-CMOS) process technology, or Silicon Germanium (SiGe) technology. The disclosed techniques can be used in oscillators for many systems, including wireless communication systems. For example, the disclosed techniques can be used in oscillators for receivers and transceivers, such as the receiver and transceiver architectures for superheterodyne receivers, image-rejection (e.g., Hartley, Weaver) receivers, zero-intermediate frequency (IF) receivers, low-IF receivers, direct-up transceivers, two-step up transceivers, and other types of receivers and transceivers for wireless technologies. When implementing the oscillators in these architectures with the disclosed tuning techniques, the system can have a lower die area and power dissipation when compared to conventional tuning techniques for crystal oscillators. Other modifications are within the scope of the following claims.

What is claimed is:

1. A method for making a digitally tuned crystal oscillator circuit, the method comprising:
    coupling an input of a digital modulator to receive a multi-bit input signal, wherein the digital modulator is configured to modulate the multi-bit input signal by oversampling, or by noiseshaping and oversampling, to produce a digitally-modulated output signal, at an output of the digital modulator, which has a lower number of bits than the multi-bit input signal;
    coupling a tuning capacitor with the crystal oscillator circuit;
    coupling a varactor with the tuning capacitor in the crystal oscillator circuit; and
    coupling the output of the digital modulator to the crystal oscillator circuit and the tuning capacitor,
    wherein:
    the oversampling or noiseshaping comprises dithering of the multi-bit input signal,
    a number of bits from the digitally-modulated output signal comprises a lower number of bits than the multi-bit input signal, and
    a capacitance of the varactor is configured to be set by controlling the capacitance of the varactor with a control voltage of (Kav*VREF1+(1−Kav)*VREF2), wherein Kav is an average value of the digitally-modulated output signal, VREF1 is a first reference voltage, and VREF2 is a second reference voltage.

2. The method of claim 1, wherein a frequency of the crystal oscillator is tunable with the digitally-modulated output signal; and
    wherein the capacitance of the varactor is configured to he set with the digitally-modulated output signal from the digital modulator by a node in the crystal oscillator circuit,
    wherein the node is switchably coupled with the first reference voltane or the sceond reference voltage.

3. The method of claim 2, wherein the capacitor comprises an adjustable capacitance, wherein the method further comprises coupling a switch in series with the tuning capacitor, wherein the switch comprises a modulatable switch.

4. The method of claim 1,
    wherein a capacitanec of the varactor is configured to be set by with the digitally-modulated output signal from the digital modulator by a node in the crystal oscillator circuit,
    wherein the node is switchably coupled with the first reference voltage or the second reference voltage,
    wherein an average capacitance of the varactor is a function of an average of reference voltages that are switched by the digitally-modulatcd output signal.

5. The method of claim 1, further comprising coupling a dithering circuit to the output of the digital modulator to add a dithering signal to a plurality of least significant bits (LSBs) in the digitally-modulated output signal, wherein the dithering signal comprises a lower number of bits than the digitally-modulated output signal.

6. The method of claim 1, wherein the digital modulator comprises any of a delta-sigma modulator, a delta modulator, a pulse-width modulator, a differential modulator, or a continuous-slope delta modulator.

7. A tuning circuit for digitally tuning a frequency of a crystal oscillator circuit having a quartz crystal, the tuning circuit comprising:
    a modulator circuit to produce a digitally-modulated output signal by noiseshaping or oversampling a multi-bit input signal, the modulator circuit comprising an input for the multibit input signal and an output for digitally-modulated output signal, wherein the digitally-modulated output signal has a lower number of bits than the multi-bit input signal, wherein the oversampling or noiseshaping comprises dithering of the multi-bit input signal;
    a tuning capacitor coupled with the crystal oscillator circuit, wherein the output of the modulator circuit is coupled to the tuning capacitor for the digitally modulated signal to adjust a capacitance of the tuning capacitor to tune the frequency of the crystal oscillator circuit;
    a dithering circuit with a dithering output coupled to the output of the modulator circuit, wherein the dithering circuit is configured to produce a dithering signal; and
    a summing circuit with inputs coupled to the dithering circuit and the modulator circuit to sum the dithering signal with the digitally-modulated output signal to reduce fixedpattcrn noise in the digitally modulated output signal, wherein the summing circuit produces a summed signal at an output of the summing circuit, wherein a number of bits from the summed signal from the summation of the dithering signal and digitally-modulated output signal comprises a lower number of bits than the multibit input signal, wherein the outptiiot the summing circuit is coupled with the tuning capacitor and the crystal oscillator circuit.

8. The tuning circuit of claim 7, where in the tuning capacitor is a switched capacitor, the switched capacitor comprising a capacitor coupled with a switch that is configured to be modulated with the digitally-modulated output signal.

9. The tuning circuit of claim 8, wherein the tuning capacitor comprises:
    a first tuning capacitor comprising a capacitance that is configured to be adjusted by circuitry to generate an average of switched-reference voltages, wherein the reference voltages are switched by the digitally-modulated output signal.

10. The tuning circuit of claim 7, wherein the tuning capacitor comprises an array of switched capacitors, wherein the switched capacitors are configured to be modulated with the output of the modulator circuit.

11. The tuning circuit of claim 7, wherein the digital modulator comprises any of a delta-sigma modulator, a noiseshaping modulator, a delta modulator, a pulse width modulator, a differential modulator, or a continuous slope delta modulator.

12. The tuning circuit of claim 7, wherein the tuning capacitor comprises a varactor.

13. The tuning circuit of claim 12, further comprising circuitry to produce an equivalent control voltage for an average capacitance of the varactor,
wherein the varactor has a capacitance that is configured to be set by using the digitally-modulated output signal from the digital modulator by switching a node in the crystal oscillator circuit between a first reference voltage and a second reference voltage, and
wherein the capacitance of the varactor is further configured to be set by controlling the capacitance of the varactor with a control voltage of (Kav*VREF1+(1 −Kav)*VREF2), wherein Kav is an average value of the digitally-modulated output signal, VREF1 is the first reference voltage, and VREF2 is the second reference voltage.

14. The tuning circuit of claim 7,
wherein the dithering signal comprises a lower number of bits than the digitally-modulated output signal, and wherein the summing circuit is configured to add the dithering signal to a plurality of least significant bits (LSBs) in the digitally modulated output signal.

15. A system comprising:
a crystal oscillator circuit comprising a quartz crystal;
a modulator circuit configured to receive a multibit input signal and to produce a digitally-modulated output signal having a lower number of bits than the multibit input signal; the modulator circuit comprising a delta-sigma or oversampling modulator to noiseshape or oversample the digitally-modulated output signal wherein the modulator circuit is further configured to dither the multi-bit input signal;
a tuning capacitor coupled in parallel with the crystal oscillator circuit, wherein an output of the modulator circuit is coupled to the tuning capacitor such that the digitally-modulated output signal adjust a capacitance of the tuning capacitor to tune the frequency of the crystal oscillator circuit;
a dithering circuit with a dithering output to produce a dithering signal; and
a summing circuit to sum the dithering signal with the dithering signal to the digitally modulated output signal for error reduction in the digitally-modulated signal, wherein a number of bits in a summed signal produced from the summation of the dithering signal and digitally modulated output signal comprises a lower number of bits than the multibit input signal.

16. The system of claim 15, wherein the dithering signal output comprises a lower number of bits than the digitally-modulated output signal, and wherein the summing circuit is configured to add the dithering signal to a plurality of least significant bits (LSBs) in the digitally-modulated output signal.

17. The system of claim 16, wherein the summing circuit is configured to reduce an energy of fixed pattern noise and spurious responses in the digitally-modulated output signal.

18. The system of claim 15, wherein:
the tuning capacitor comprises a varactor,
the system further comprises circuitry to produce an equivalent control voltage for an average capacitance of the varactor,
the varactor comprises a capacitance that is configured to be set by using the digitally-modulated output signal from the digital modulator by switching a node in the crystal oscillator circuit between a first reference voltage and a second reference voltage, and
the capacitance of the varactor is further configured to be set by controlling the capacitance of the varactor with a control voltage of (Kav*VREF1+(1−Kav)*VREF2), wherein Kav is an average value of the digitally-modulated output signal, VREF1 is the first reference value, and VREF2 is the second reference voltage.

19. The system of claim 15, wherein a resolution of the crystal oscillator circuit is greater than 10 bits of resolution.

20. A method for making a digitally-tuned crystal oscillator circuit, the method comprising:
coupling an input of a digital modulator to receive a multi-bit input signal, wherein the digital modulator is configured to modulate the multi-bit input signal by oversampling, or by noiseshaping and oversampling, to produce a digitally-modulated output signal at output of the digital modulator, wherein the digitally-modulated output signal comprises a lower number of bits than the multi-bit input signal;
coupling a tuning capacitor with a crystal oscillator circuit;
coupling a summing circuit with the output of the digital modulator and an output of a dithering circuit to generate a summed signal, wherein the dithering circuit is configured to generate a multi-bit dithering sipal at an output of the dithering circuit; and
coupling an output of the summing circuit with the tuning capacitor and the crystal oscillator circuit,
wherein the modulation of the digitally-modulated output signal comprises dithering of the multi-bit input signal.

21. The method of claim 20, wherein the multi-bit dithering signal is summed with the digitally-modulated output signal to minimize error in the digitally-modulated output signal by reducing fixed pattern noise in the digitally-modulated output signal.

22. The method of claim 20, wherein the summing circuit produces a summed signal, and wherein a number of bits from the summed signal from the summation of the multi-bit dithering signal and the digitally-modulated output signal comprises a lower number of bits than the multi-bit input signal.

23. An apparatus comprising
a digital modulator having an input to receive a multi-bit input signal, wherein the digital modulator is configured to modulate the multi-bit input signal by oversampling, or by noiseshaping and oversampling, to produce a digitally-modulated output signal at an output of the digital modulator, wherein the digitally-modulated output signal comprises a lower number of bits than the multibit input signal;
a tuning capacitor;
an array of switched-capacitors coupled to the tuning capacitor;
a crystal oscillator circuit coupled with the tuning capacitor;
a dithering circuit to generate a multibit dithering signal at an output of the dithering circuit; and
a summing circuit having inputs coupled with the output of the digital modulator and the output of a dithering circuit to generate a summed signal at an output of the summing circuit, wherein:
the output of the summing circuit is coupled with the capacitors and the crystal oscillator circuit,
the modulation of the digitally-modulated output signal comprises dithering of the multi-bit input signal.

24. The apparatus of claim 23, wherein the multi-bit dithering signal is summed with the digitally modulated output signal to minimize error in the digitally modulated output signal by reducing fixed pattern noise in the digitally-modulated output signal.

25. The apparatus of claim 23, wherein the summing circuit is configured to produce a summed signal, and wherein a number of bits from the summed signal from the summation of the multi-bit dithering signal and the digitally-modulated output signal comprises a lower number of bits than the multi-bit input signal.

* * * * *

UNITED STATES PATENT AND TRADEMARK OFFICE
CERTIFICATE OF CORRECTION

PATENT NO. : 7,532,079 B2  Page 1 of 4
APPLICATION NO. : 11/764701
DATED : May 12, 2009
INVENTOR(S) : David Shen It is certified that error appears in the above-identified patent and that said Letters Patent is hereby corrected as shown below:

Title Page, Col. 2, (Other Publications), please delete "State-of the-Art" and insert therefore --State-of-the-Art--.

Title Page, Col. 2, (57) Abstract, line 13, after "can", please insert --be--.

Column 3, line 59, please delete "C1" and insert therefore --$C_1$--.

Column 3, line 60, please delete "Co" and insert therefore --$C_0$--, both instances.

Column 3, line 62, please delete "C1" and insert therefore --$C_1$--.

Column 3, line 64, please delete "C1" and insert therefore --$C_1$--.

Column 7, line 51, Claim 1, please delete "Kav" and insert therefore --$K_{av}$--, both instances.

Column 7, line 51, Claim 1, please delete "Kav" and insert therefore --$K_{av}$--.

Column 7, line 55, Claim 2, please delete

"2. The method of claim 1, wherein a frequency of the crystal oscillator is tunable with the digitally-modulated output signal; and
    wherein the capacitance of the varactor is configured to he set with the
      digitally-modulated output signal from the digital modulator by a node
      in the crystal oscillator circuit,
    wherein the node is switchably coupled with the first reference voltage or the
      second reference voltage."

and insert therefore

--2. The method of claim 1, wherein a frequency of the crystal oscillator is tunable with the digitally-modulated output signal; and
    wherein the capacitance of the varactor is configured to be set with the
digitally-modulated output signal from the digital modulator by a node in the crystal oscillator circuit, wherein the node is switchably coupled with the first reference voltage or the second reference voltage.--

UNITED STATES PATENT AND TRADEMARK OFFICE
CERTIFICATE OF CORRECTION

PATENT NO. : 7,532,079 B2
APPLICATION NO. : 11/764701
DATED : May 12, 2009
INVENTOR(S) : David Shen It is certified that error appears in the above-identified patent and that said Letters Patent is hereby corrected as shown below:

Column 8, line 2, Claim 4, please delete "capacitanec" and insert therefore --capacitance--.

Column 8, line 10, Claim 4, please delete "digitally-modulatcd" and insert therefore --digitally-modulated--.

Column 8, line 27, Claim 7, please delete "multibit" and insert therefore --multi-bit--; and after "output for" please insert --the--.

Column 8, lines 35-36, Claim 7, please delete "digitally modulated" and insert therefore --digitally-modulated--.

Column 8, line 44, Claim 7, please delete "fixedpattcm" and insert therefore --fixed pattern--; and please delete "digitally modulated" and insert therefore --digitally-modulated--.

Column 8, line 50, Claim 7, please delete "multibit" and insert therefore --multi-bit--; and please delete "outptiiot" and insert therefore --output of--.

Column 8, line 53, Claim 8, please delete "where in" and insert therefore --wherein--.

Column 9, line 17, Claim 13, please delete "Kav" and insert therefore --$K_{av}$--, first instance; and please delete "(1 -Kav)" and insert therefore --(1-$K_{av}$)--.

Column 9, line 18, Claim 13, please delete "Kav" and insert therefore --$K_{av}$--.

Column 9, line 27, Claim 14, please delete "digitally modulated" and insert therefore --digitally-modulated--.

Column 9, line 30, Claim 15, please delete "multibit" and insert therefore --multi-bit--.

UNITED STATES PATENT AND TRADEMARK OFFICE
CERTIFICATE OF CORRECTION

PATENT NO. : 7,532,079 B2
APPLICATION NO. : 11/764701
DATED : May 12, 2009
INVENTOR(S) : David Shen It is certified that error appears in the above-identified patent and that said Letters Patent is hereby corrected as shown below:

Column 9, line 32, Claim 15, please delete "multibit" and insert therefore --multi-bit--.

Column 9, line 35, Claim 15, after "signal" please insert --,--.

Column 9, line 36, Claim 15, please delete "configurod" and insert therefore --configured--.

Column 9, line 38, Claim 15, please delete "couplcd" and insert therefore --coupled--.

Column 9, line 41, Claim 15, please delete "adjust" and insert therefore --adjusts--.

Column 9, line 47, Claim 15, please delete "digitally modulated" and insert therefore --digitally-modulated--.

Column 9, line 50, Claim 15, please delete "ot" and insert therefore --of--.

Column 9, lines 50-51, please delete "digitally modulated" and insert therefore --digitally-modulated--.

Column 9, line 52, Claim 15, please delete "multibit" and insert therefore --multi-bit--.

Column 9, line 54, Claim 16, before "comprises", please delete "output".

Column 9, line 59, Claim 17, please delete "system" and insert therefore --system--.

Column 9, line 65, Claim 18, please delete "compriscs" and insert therefore --comprises--.

Column 10, line 8, Claim 18, please delete "Kav" and insert therefore --$K_{av}$--, both instances.

Column 10, line 9, Claim 18, please delete "Kav" and insert therefore --$K_{av}$--.

UNITED STATES PATENT AND TRADEMARK OFFICE
CERTIFICATE OF CORRECTION

PATENT NO. : 7,532,079 B2
APPLICATION NO. : 11/764701
DATED : May 12, 2009
INVENTOR(S) : David Shen It is certified that error appears in the above-identified patent and that said Letters Patent is hereby corrected as shown below:

Column 10, line 20, Claim 20, please delete "at output" and insert therefore --at an output--.

Column 10, line 28, Claim 20, please delete "sipal" and insert therefore --signal--.

Column 10, line 44, Claim 23, after "comprising" please insert --:--.

Column 10, line 50, Claim 23, please delete "thc" and insert therefore --the--.

Column 10, line 51, Claim 23, please delete "multibit" and insert therefore --multi-bit--.

Column 10, line 58, Claim 23, please delete "multibit" and insert therefore --multi-bit--.

Column 11, line 2, Claim 24, please delete "digitally modulated" and insert therefore --digitally-modulated--.

Column 11, line 3, Claim 24, please delete "digitally modulated" and insert therefore --digitally-modulated--.

Signed and Sealed this

Eleventh Day of August, 2009

David J. Kappos
*Director of the United States Patent and Trademark Office*